US009465689B2

(12) United States Patent
Benjamini et al.

(10) Patent No.: US 9,465,689 B2
(45) Date of Patent: Oct. 11, 2016

(54) FORWARD ERROR CORRECTION SYNCHRONIZATION

(71) Applicant: GLOBALFOUNDRIES Inc., Grand Cayman (KY)

(72) Inventors: Yiftach Benjamini, Givat Ela (IL); Adrian S. Butter, Binghamton, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 105 days.

(21) Appl. No.: 14/548,929

(22) Filed: Nov. 20, 2014

(65) Prior Publication Data

US 2016/0149595 A1    May 26, 2016

(51) Int. Cl.
| | |
|---|---|
| *G06F 11/10* | (2006.01) |
| *H04L 1/00* | (2006.01) |
| *H04L 27/26* | (2006.01) |
| *H03M 13/33* | (2006.01) |
| *H03M 13/03* | (2006.01) |

(52) U.S. Cl.
CPC ............ *G06F 11/10* (2013.01); *H03M 13/333* (2013.01); *H04L 1/004* (2013.01); *H04L 27/2655* (2013.01); *H03M 13/03* (2013.01)

(58) Field of Classification Search
CPC .. H03M 13/00; H03M 13/33; H03M 13/333; H03M 13/03; H04L 1/0041; H04L 1/0047; H04L 1/0045; H04L 1/004; H04L 27/2655; G06F 11/10
See application file for complete search history.

(56) References Cited

U.S. PATENT DOCUMENTS

| | | | | |
|---|---|---|---|---|
| 6,560,745 | B1 * | 5/2003 | McCloskey ........... | H03M 13/00 375/145 |
| 2003/0037297 | A1 * | 2/2003 | Araki .................... | H04J 3/0608 714/746 |

FOREIGN PATENT DOCUMENTS

| | | | | |
|---|---|---|---|---|
| WO | WO2008/147151 | * | 12/2008 | ......... H04N 21/2365 |
| WO | WO2011/023489 | * | 3/2011 | ............. H04L 7/048 |

OTHER PUBLICATIONS

Disclosed Anonymously, "A Novel Method for Fast 32G Fiber Channel Link Synchronization," IPCOM000236889D, IP.com Electronic Publication: May 21, 2014.
Yong-Geol Shim, "A Channel Coding Scheme with Enhanced Synchronization Capability," International Journal of Multimedia and Ubiquitous Engineering, vol. 8, No. 3, May 2013, pp. 179-188.

* cited by examiner

*Primary Examiner* — Shelly A Chase
(74) *Attorney, Agent, or Firm* — Heslin Rothenberg Farley & Mesiti P.C.

(57) ABSTRACT

Techniques for forward error correction synchronization are described herein. The techniques include receiving a bit stream over a transmission link and determining a starting location of a first code word within the bit stream. Determining the starting location of the first code word includes identifying an error correction block associated with a previously received second code word, and designating a bit subsequent to the error correction block as the starting location of the first code word.

20 Claims, 5 Drawing Sheets

200

FORWARD ERROR CORRECTION SYNCHRONIZATION

BACKGROUND

The present invention relates to forward error correction synchronization. In telecommunication, information theory, and coding theory, forward error correction (FEC) or channel coding is a technique used for controlling errors in data transmission over high speed, unreliable, or noisy communication channels.

For example, in 32 Gigabit Fiber Channel transmission links, FEC hardware logic is added to a network stack of components receiving and transmitting data. The transmission includes a data stream that is partitioned into multiple code words. The FEC hardware may calculate and insert a checksum after each transmitted code word. In the 32 Gigabit Fiber Channel implementation a code word may be 5280 bits long including 5140 bits for the code words and 140 bits for a checksum portion. On a receive side, FEC hardware logic processes a complete code word and can use the data in the checksum portion to correct a certain amount of errors in the code word. The receive side may need to identify a starting point of the multiple code words. If the FEC hardware logic identifies a starting bit position in which the amount of errors in a given code word equals zero, and a subsequent code word contains no errors, the starting bit position may be identified as the correct starting position. In 32 Gigabit Fiber Channel, identifying the starting point may be done by processing each FEC code word at each possible starting position in the data stream. In other words, the FEC hardware logic may be required to attempt processing of the FEC code words at each of the 5280 bits.

SUMMARY

In one embodiment, computer implemented method for forward error correction synchronization is described herein. The method may include receiving a bit stream over a transmission link and determining a starting location of a first code word within the bit stream. Determining the starting location of the first code word includes identifying an error correction block associated with a previously received second code word, and designating a bit subsequent to the error correction block as the starting location of the first code word.

In another embodiment, an apparatus having logic, at least partially comprising hardware logic of a transmission link, is described herein. The logic is configured to receive a bit stream and determine a starting location of a first code word within the bit stream. Determining the starting location of the first code word includes identifying an error correction block associated with a previously received second code word and designating a bit subsequent to the error correction block as the starting location of the first code word.

In yet another embodiment, computer program product for forward error correction synchronization is described herein. The computer product includes a computer readable storage medium having program code embodied therewith, the program code executable by a processor to perform a method including receiving a bit stream over a transmission link and determining a starting location of a first code word within the bit stream. Determining the starting location of the first code word includes identifying an error correction block associated with a previously received second code word, and designating a bit subsequent to the error correction block as the starting location of the first code word.

DETAILED DESCRIPTION

Figure 1:
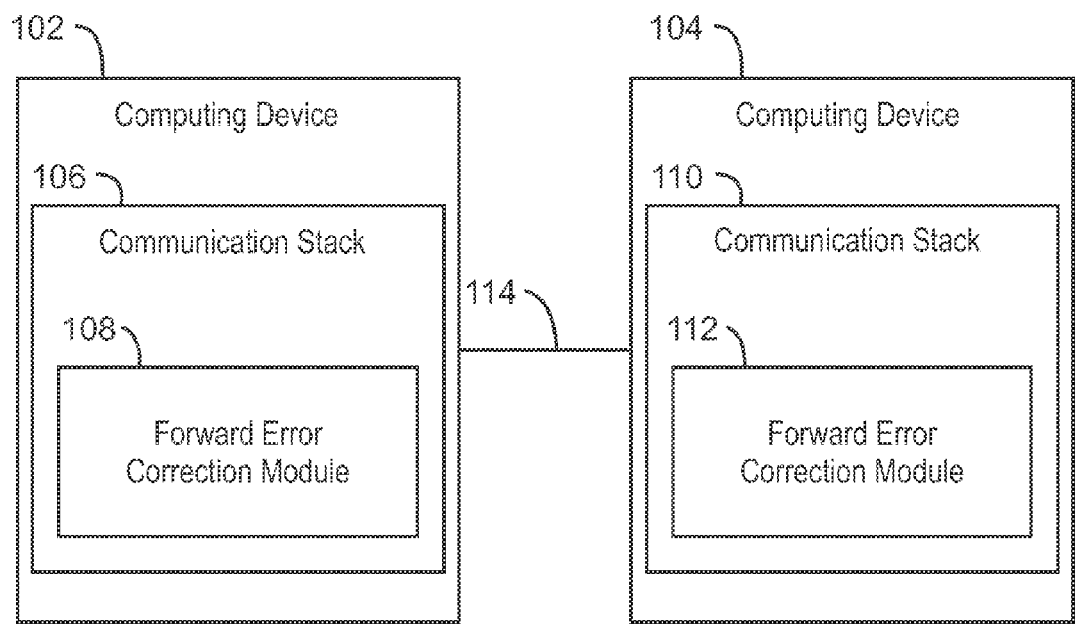
FIG. 1 is a block diagram of computing systems having forward error correction modules.

The subject matter disclosed herein relates to techniques for forward error correction (FEC) synchronization. As discussed above, FEC may be implemented in a transmission line to reduce errors in a bit stream. In order to perform FEC synchronization, a code word must be identified in a transmitted bit stream. However, during link start up or bring-up, identifying the accurate beginning of the code word may be difficult. Therefore, the techniques described herein include identifying an error correction block that is disposed at the end of a code word block, and designating a bit subsequent to the error correction block as a starting location for a subsequent code word.

In some cases, after a transmission link has been put to sleep, the link may be woken up and enter either a link idle or link low power mode. During link idle and low power mode, known bit patterns are provided across the link. However, a portion of a transmitted bit stream may include the error detection block, such as a checksum, that is associated with an unknown data pattern. Therefore, the error detection block may be identified when FEC logic detects the unknown pattern, and the subsequent bit is designated as the beginning of a code word to be used in FEC synchronization. The techniques described herein may reduce the time required to synchronize the transmission link after being woken up since each of starting location within a bit stream does not necessarily need to be tried before initializing the synchronization process.

In some cases, the techniques described herein are implemented in a Fibre Channel standard. In a Fibre Channel standard data scrambling, low power (LP) mode, and Low Power (LP) mode exit, Low Power Idle (LPI), and the like may be enabled. Data scrambling refers to a process of scrambling data before transmission and descrambling the data upon reception. In some cases, data scrambling may ensure a significant number of data edges occur. A significant number of data edges may be caused by a data value to be transmitted changes between a logical one to a logical zero. However, data scrambling may be disabled during LP exit mode. Specifically, during LP exit mode, data scrambling is disabled, and there may be only two possible data patterns: an IDLE symbol and a LPI symbol, as well as an unknown pattern associated with an error correction block, such as a checksum.

LP mode may refer to a predetermined time between the transmitter and receiver wherein both the transmitter and receiver cease communications. LP mode exit may refer to a transition when after the predetermined time of the LP mode a transmission link may be re-established and code word synchronization may need to be achieved. In some cases, it may be beneficial to have the transmission link synchronized and working as fast as possible. As discussed above, during LP exit mode, possible data patterns may be limited. In LIP Fast Sync, a receiver may not need to check for every possible starting bit position, as it can identify the known patterns being sent. For example, a receiver may only need to check at most twenty possible starting positions as there are 20 symbols in an FEC code word. The techniques described herein may decrease the number of possible starting positions by identifying a code word starting position as a bit immediately following with an unknown data pattern associated with a previously received error correction block.

FIG. 1 is a block diagram of computing systems having forward error correction modules. A first computing device 102 may be communicatively coupled to a second computing device 104. The first computing device 102 may include a communication stack 106 having a FEC module 108. The second computing device 104 may include a communication stack 110 and a FEC module 112 similar to the components of the first computing device 102.

The communication stacks 106 and 110 may be configured to receive communications over a link 114. In some cases, the link 114 may be configured to shut down when no communications are being transmitted over the link. In this scenario, at least a portion of the communication stacks 106 and 110 may be powered down to preserve energy. After a predetermined time, each of the communication stacks 106 and 110 may be powered up to determine whether any communications are being transmitted on the link. During this stage, each of the communications stacks 106 and 110 may enter either an idle stage or low idle stage. In these stages, the communications stacks 106 and 110 may need to be synchronized.

The communication stacks 106 and 110 may be logic, at least partially comprising hardware logic. In some cases, at least a portion of the communication stack 106 may be implemented by processor-executable code. The FEC modules 108 and 112 may also be implemented as logic, at least partially comprising hardware logic. The FEC modules 108 and 112 may be configured to transmit a code word. For example, the link 114 may be a 32 Gigabit Fiber Channel, wherein a code word comprises 5280 bits. The code word may be followed by an error detection block, such as a checksum configured to detect errors within the code word and correct a predetermined amount of errors within the code word. Correction of errors may enable the link 114 to be synchronized such that each computing device 102 and 104 may receive communications via the link 114. The FEC modules 108 and 112 may be configured to determine a starting point of a code word as a bit stream is received.

During idle and low idle modes, the code words may have a known pattern. In contrast, the error detection block following a code word may have an unknown pattern. In the techniques described herein, the FEC modules 108 and 110 may be configured to monitor incoming bit streams for known patterns associated with the code words and unknown patterns associated with the error detection block. As discussed above, a given code word will be immediately followed by an error detection block associated with the code word. The FEC modules 108 and 110 may identify a bit immediately following an error detection block and designate the identified bit as a starting point of a subsequent code word transmission.

For example, a code word may comprise 5140 bits followed by an error detection block of 140 bits. After detection of the error detection block, a subsequently transmitted code word immediately following the error detection block is identified and a subsequently transmitted error detection block may be used to identify and correct errors within the subsequently transmitted code word for link synchronization. Further details are discussed below.

Figure 2:
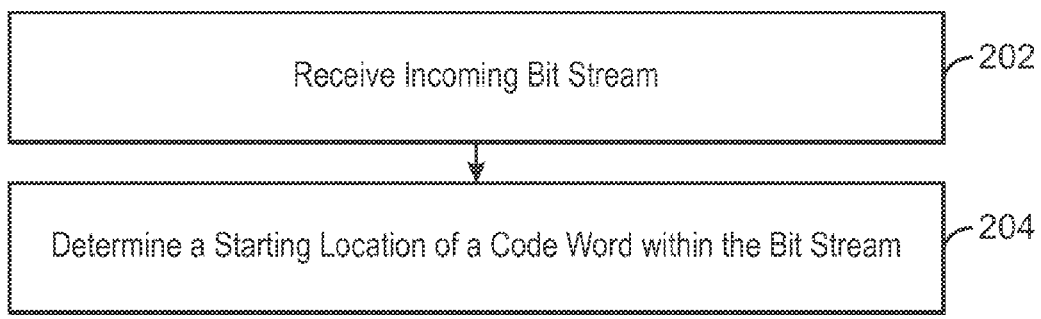
FIG. 2 is a block diagram illustrating a method of designating a starting bit for forward error correction synchronization.

FIG. 2 is a block diagram illustrating a method of designating a starting bit for forward error correction synchronization. At block 202 an incoming bit stream is received. The incoming bit stream may be received at a communications stack, such as one of the communication stacks 106 and 110 of FIG. 1. The incoming bit stream may be received during idle or low power idle, wherein data patterns are known for transmitted code words. At block 204, a starting location is determined for a first code word within the bit stream. As discussed above in regard to FIG. 1, and in more detail below in regard to FIG. 3 and FIG. 4, the starting location may be determined by identifying an error correction block associated with a previously received second code word. A bit subsequent to the error correction block associated with the previously received code word may be designated as the starting location of the first code word.

Figure 3:
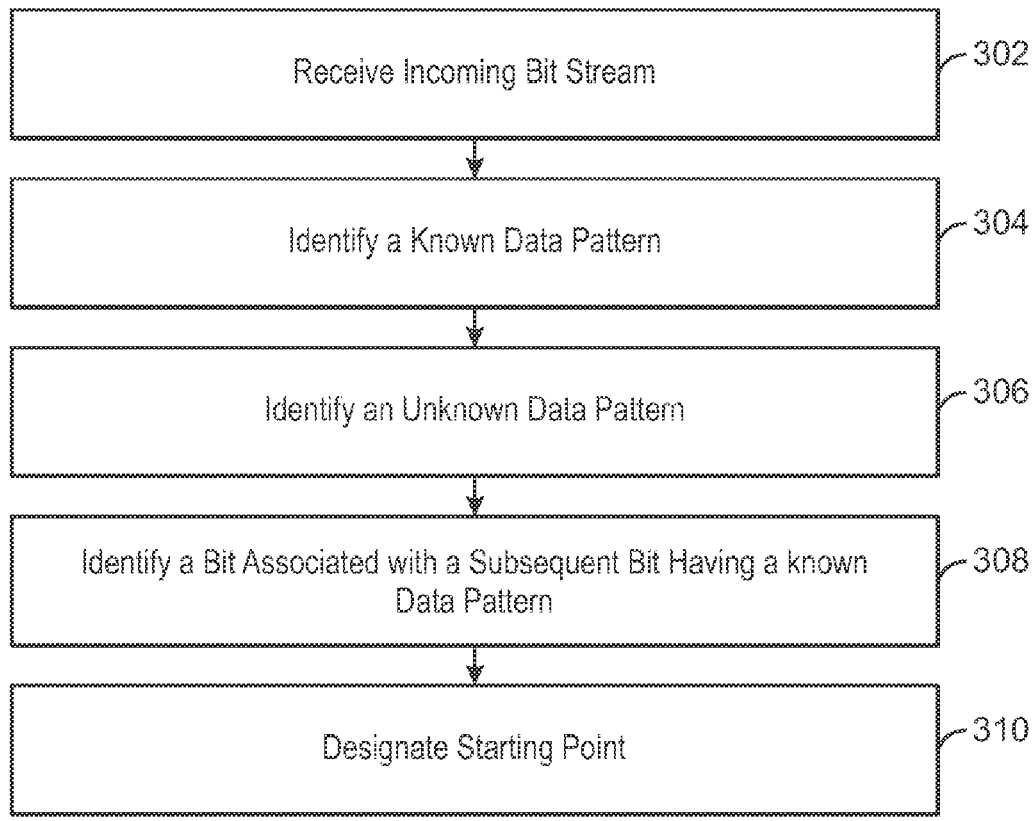
FIG. 3 is a flow diagram illustrating a designation of a starting point for forward error correction synchronization.

FIG. 3 is a flow diagram illustrating a designation of a starting point for forward error correction synchronization. At 302, an incoming bit stream is received. At block 304 a known data pattern is identified. The known data pattern is associated with the code word to be error corrected. However, to determine the starting point of the code word to be corrected, an error correction block of a previously received code word must be determined. As indicated at block 306, an unknown data pattern is identified. The unknown pattern is associated with the error correction block associated with a previously received code word. At 308, A bit received immediately subsequent to the error correction block may be identified as a starting point of a subsequent code word, and, therefore, the bit is designated as the starting point of the code word at block 310.

Other method steps may be implemented. For example, the process flow diagram of FIG. 3 may further include bypassing scrambling of a bit stream until synchronization is complete. The bypass of scrambling during this period may enable known and unknown data patterns to be identified. Once synchronization is complete, scrambling of the bit stream may be reinitiated.

Figure 4:
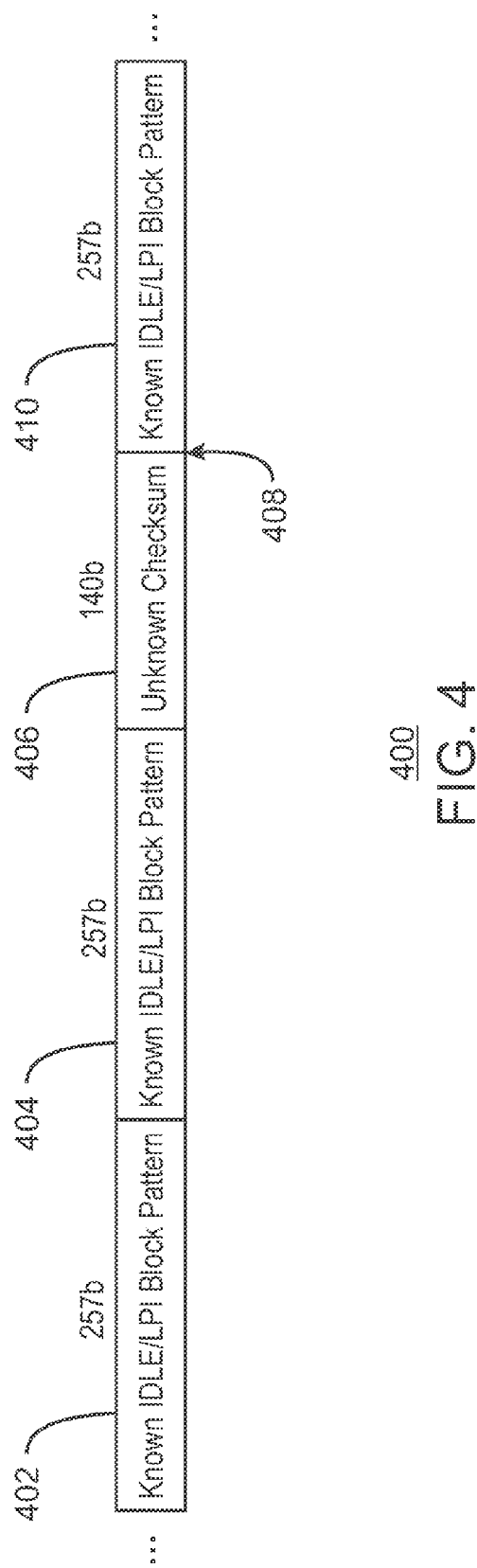
FIG. 4 is a block diagram illustrating an example data stream and a newly designated starting point.

FIG. 4 is a block diagram illustrating an example data stream and a newly designated starting point. As discussed above, the data stream may be associated with a 32 Gigabit Fiber Channel. In this case, a code word is portioned into 20 blocks of 257 bits each. Each of the 20 blocks may have a known data pattern associated with either the idle or low power idle state. As illustrated in FIG. 4, blocks 402 and 404 are blocks of a previously received code word. Logic, such as the FEC modules 108 and 112 of FIG. 1 may be configured to detect the known patterns and detect an unknown pattern of the error detection block 406 associated with the blocks 402 and 404. After detecting 140 bits of the unknown pattern, the FECT modules 108, 112 may be configured to designate a starting position at 408 of a subsequently received code word, indicated at 410.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 5:
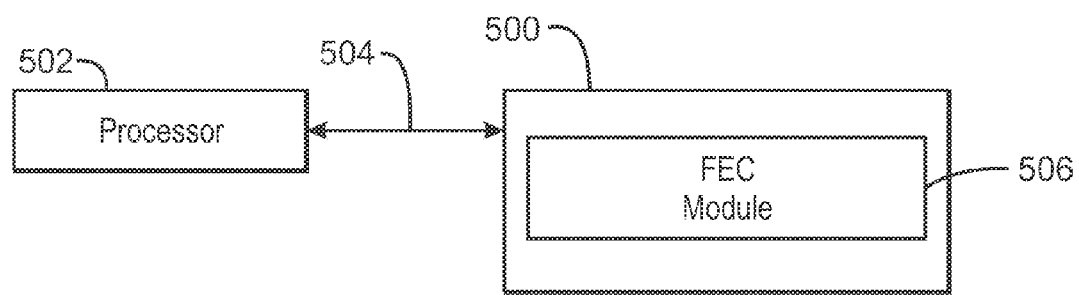
FIG. 5 is a block diagram depicting an example of a tangible, non-transitory computer-readable medium that can be used for forward error correction synchronization.

FIG. 5 is a block diagram depicting an example of a tangible, non-transitory computer-readable medium that can be used for forward error correction synchronization. The tangible, non-transitory, computer-readable medium 500 may be accessed by a processor 502 over a computer bus 504. Furthermore, the tangible, non-transitory, computer-readable medium 500 may include computer-executable instructions to direct the processor 502 to perform the steps of the current method.

The various software components discussed herein may be stored on the tangible, non-transitory, computer-readable medium 500, as indicated in FIG. 5. For example, an FEC module 506 may be configured to receive a bit stream over a transmission link and determine a starting location of a first code word within the bit stream. Determining the starting location of the first code word includes identifying an error correction block associated with a previously received second code word, and designating a bit subsequent to the error correction block as the starting location of the first code word.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer implemented method for forward error correction synchronization, comprising:
  receiving a bit stream over a transmission link;
  determining a starting location of a first code word within the bit stream, wherein determining the starting location of the first code word comprises:
    identifying an error correction block associated with a previously received second code word; and
    designating a bit subsequent to the error correction block as the starting location of the first code word.

2. The computer implemented method of claim 1, wherein the error correction block is a checksum for verifying data integrity of the second code word.

3. The computer implemented method of claim 1, wherein the designated bit is immediately subsequent to the error correction block.

4. The computer implemented method of claim 1, wherein identifying the error correction block comprises:
  detecting one of two known data patterns associated with code words comprising the first and second code word; and
  detecting an unknown data pattern associated with the error correction block.

5. The computer implemented method of claim 4, wherein the known data patterns are data patterns present after waking up a transmission link.

6. The computer implemented method of claim 5, wherein the known data patterns comprise data patterns associated with transmission link states comprising:
  an idle state;
  a low idle state; or
  any combination thereof.

7. The computer implemented method of claim 6, further comprising bypassing scrambling of the bit stream until synchronization is complete.

8. An apparatus, comprising logic, at least partially comprising hardware logic of a transmission link, wherein the logic is to:
  receive a bit stream;
  determine a starting location of a first code word within the bit stream, wherein determining the starting location of the first code word comprises:
    identifying an error correction block associated with a previously received second code word; and
    designating a bit subsequent to the error correction block as the starting location of the first code word.

9. The apparatus of claim 8, wherein the error correction block is a checksum for verifying data integrity of the second code word.

10. The apparatus of claim 8, wherein the designated bit is immediately subsequent to the error correction block.

11. The apparatus of claim 8, wherein identifying the error correction block comprises:
  detecting one of two known data patterns associated with code words comprising the first and second code word; and
  detecting an unknown data pattern associated with the error correction block.

12. The apparatus of claim 11, wherein the known data patterns are data patterns present after waking up a component on a transmission link.

13. The apparatus of claim 12, wherein the known data patterns comprise data patterns associated with transmission link states comprising:
  an idle state;
  a low idle state; or
  any combination thereof.

14. The apparatus of claim 13, wherein the logic is further configured to bypass scrambling of the bit stream until synchronization is complete.

15. A computer program product for forward error correction synchronization, the computer product comprising a non-transitory computer readable storage medium having program code embodied therewith, the program code executable by a processor to perform a method comprising:
  receiving a bit stream;
  determining a starting location of a first code word within the bit stream, wherein determining the starting location of the first code word comprises:
    identifying an error correction block associated with a previously received second code word; and
    designating a bit subsequent to the error correction block as the starting location of the first code word.

16. The computer program product of claim 15, wherein the error correction block is a checksum for verifying data integrity of the second code word.

17. The computer program product of claim 15, wherein the designated bit is immediately subsequent to the error correction block.

18. The computer program product of claim 15, wherein identifying the error correction block comprises:
  detecting one of two known data patterns associated with code words comprising the first and second code word; and
  detecting an unknown data pattern associated with the error correction block.

19. The computer program product of claim 18, wherein the known data patterns are data patterns present after waking up a component on a transmission link, further comprising bypass scrambling of the bit stream until synchronization is complete.

20. The computer program product of claim 19, wherein the known data patterns comprise data patterns associated with transmission link states comprising:
  an idle state;
  a low idle state; or
  any combination thereof.

* * * * *